United States Patent [19]
Yanagida

[11] Patent Number: 5,726,097
[45] Date of Patent: Mar. 10, 1998

[54] METHOD OF FORMING MULTILEVEL INTERCONNECTIONS USING HIGH DENSITY PLASMA METAL CLEAN

[75] Inventor: Toshiharu Yanagida, Kanagawa, Japan

[73] Assignee: Sony Corporation, Tokyo, Japan

[21] Appl. No.: 506,640

[22] Filed: Jul. 25, 1995

[30] Foreign Application Priority Data

Jul. 28, 1994 [JP] Japan .................... 6-177272

[51] Int. Cl.$^6$ .............................................. H01L 21/4763
[52] U.S. Cl. ........................... 438/622; 438/688; 438/906
[58] Field of Search ................................ 437/195, 187, 437/194; 438/622, 688, 906

[56] References Cited

U.S. PATENT DOCUMENTS

| | | | |
|---|---|---|---|
| 4,704,301 | 11/1987 | Bauer et al. | 438/906 |
| 4,705,595 | 11/1987 | Okudaira et al. | 156/643 |
| 4,985,372 | 1/1991 | Narita | 438/906 |
| 5,316,975 | 5/1994 | Maeda | 438/906 |
| 5,403,434 | 4/1995 | Moslehi | 156/643 |
| 5,447,613 | 9/1995 | Ouellet | 204/192.1 |
| 5,498,768 | 3/1996 | Nishitani et al. | 438/906 |
| 5,512,512 | 4/1996 | Isobe | 437/187 |
| 5,629,236 | 5/1997 | Wada et al. | 438/622 |

OTHER PUBLICATIONS

New Contact Process Using Soft Etch for Stable Ohmic Characteristics and Its Application to 0.1 micron CMOS Devices, Dec. 11, 1994, IEDM.
Wolf et al., *Silicon Processing For The VLSI Era*, vol. I, Lattice Press, 1986, p. 520.

*Primary Examiner*—Charles L. Bowers, Jr.
*Assistant Examiner*—Lynne A. Gurley
*Attorney, Agent, or Firm*—Ronald P. Kananen

[57] ABSTRACT

A method of manufacturing a semiconductor device having multilevel interconnections comprising the steps of forming a lower interconnecting layer on a semiconductor substrate, forming a second interlayer insulation film on the lower interconnecting layer and forming a contact hole so as to expose the surface of the lower interconnecting layer, removing a native oxide film formed to the surface of the lower interconnecting layer by a non-oxidative plasma processing by using a plasma processing device at a plasma density between $1\times10^{11}/cm^3$ and $1\times10^{14}/cm^3$ while applying a substrate bias voltage of 200 V or higher and lower than 800 V, forming an upper interconnecting layer so as to fill the contact hole after removal of the native oxide film.

17 Claims, 5 Drawing Sheets

F I G. 5
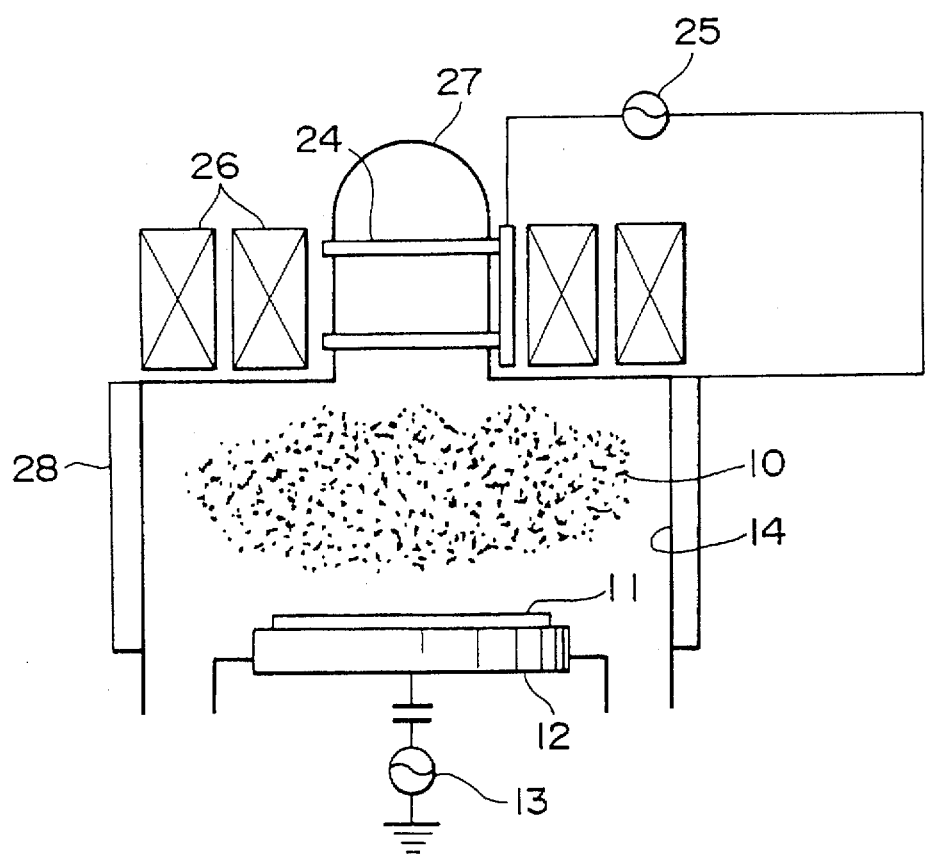

METHOD OF FORMING MULTILEVEL INTERCONNECTIONS USING HIGH DENSITY PLASMA METAL CLEAN

BACKGROUND OF THE INVENTION

1. Field of the Invention

The present invention relates to a method of manufacturing a semiconductor device and more in particular to a method of forming multilevel interconnections capable of attaining interlayer connection uniformly in a contact hole at a high reliability.

2. Description of Related Art

Along with development for high integration high performance of semiconductor devices such as LSI, an area ratio of wiring portions present on a semiconductor chip has been increased. To avoid an increase in the semiconductor chip surface area, a multilevel interconnection becomes essential for the process of opening a contact hole to an interlayer insulation film between interconnecting layers for making an electric connection.

A metallization process has been employed for opening a contact hole to an interlayer insulation film on lower interconnectings made of Al-based metal or the like and for providing an electrode material in the contact hole, for forming a film on an upper interconnecting material over the entire surface on an interlayer insulation film including the inside of the contact hole. When the metallization processes is applied, it is important to remove a native oxide film formed on the surface of the lower interconnections exposed to the bottom of the contact hole for attaining multilevel interconnections of low resistivity and high reliability.

A similar problem occurs also in a contact hole facing an active layer such as an impurity diffusion layer formed on a semiconductor substrate, for example, made of Si. In this case, the native oxide film at the bottom of the contact hole comprises a silicon oxide material, which has been removed by cleaning with an aqueous solution of dilute HF. Cleaning with the aqueous solution of dilute HF is isotropic wet etching and, accordingly, side walls of the contact hole are etched at the same time with the removal of the native oxide film, so that the shape of the contact hole varies. In addition, in the case of a fine contact hole, the dilute aqueous HF solution can not sufficiently reach the inside of the hole to remove the native oxide film uniformly.

In view of the above, RF sputter etching using a rare gas has been attempted in recent years by using a parallel plate type plasma processing device instead of wet etching. However, as the size of the contact hole becomes smaller and the diameter of the substrate to be processed is increased, a problem of variation of processing speed occurs across a surface of the substrate to be processed. This results in damage caused by the sputtering to an active layer such as an impurity diffusion layer or an increase in contact resistance due to incomplete removal of the native oxide film. Therefore, in a contact hole in which the state of the boundary significantly impacts a device characteristic, no practical dry process that can be adopted instead of cleaning by the aqueous solution of dilute HF has yet been presented.

SUMMARY OF THE INVENTION

The present invention has been accomplished under the foregoing technical background and an object thereof is to provide a method of forming multilevel interconnections capable of thoroughly removing a native oxide film formed at the bottom of a contact hole on lower interconnections without damaging a substrate to be processed.

Another object of the present invention is to provide a method of forming multilevel interconnections capable of uniformly removing a native oxide film formed at the bottom of a number of fine contact holes having a large aspect ratio on a lower interconnection relative to a large-diameter substrate to be processed.

Other objects of the present invention will become apparent by reading the descriptions of the specification with reference to the accompanying drawings.

A method of forming multilevel interconnections according to the present invention has been proposed for overcoming the foregoing problems including a step of removing a native oxide film on the surface of lower interconnections exposed at the bottom of a contact hole facing the lower interconnections and then continuously forming an upper interconnections, wherein the step of removing the native oxide film comprises applying a non-oxidative plasma processing by using a plasma processing device having a diffusion type plasma generation source capable of obtaining a plasma density of more than $1 \times 10^{11}/cm^3$ and less than $1 \times 10^{14}/cm^3$, while applying a substrate bias voltage which is 200 V or higher and lower than 800 V. The present invention is effective in a case where at least an upper portion of the lower interconnections comprises an Al-based metal layer.

After removing the native oxide film mainly composed, for example, of $Al_2O_3$ on the lower interconnections, the upper interconnections are desirably formed continuously in-situ, in which a substrate to be processed is transported by way of a gate valve under vacuum to a film-forming device and then the upper interconnections may be formed directly. The term upper interconnections used herein means electrode and interconnecting layers made of electrode material to be filled in the contact hole or wiring materials formed as a film on the entire surface of the interlayer insulation film including the inside of the contact hole.

The plasma processing device having a diffusion type plasma generation source capable of obtaining a plasma density of between $1 \times 10^{11}/cm^3$ and $1 \times 10^{14}/cm^3$ can include, for example, an ECR (Electron Cyclotron Resonance) plasma processing device, an ICP (Inductively Coupled Plasma) processing device, a TCP (Transformer Coupled Plasma) processing device, a helicon wave plasma processing device or the like. Since the plasma processing devices described above can generate a high density plasma between about $1 \times 10^{11}/cm^3$ and $10^{14}/cm^3$, they are capable of conducting plasma processing at high efficiency. Technical explanations for each of the high density plasma processing devices described above are not stated since they are detailed in their individual technical reports or the like and they are collectively described in pages 59–94, Monthly Semiconductor World Journal, October, 1993.

The essential feature of the present invention resides in removing a native oxide film such as $Al_2O_3$ on lower interconnections, by using a plasma processing device having a diffusion type high density plasma generation source capable of obtaining a plasma density between $1 \times 10^{11}/cm^3$ and $1 \times 10^{14}/cm^3$, and applying non-oxidative high density plasma processing while applying a substrate bias voltage within the specified range. Such a diffusion type plasma generation source can apply a much more uniform processing compared with an existent parallel plate type plasma processing device since diffusion plasma processing is conducted to a substrate to be processed in a plasma processing chamber contiguous with the plasma generation source. The native oxide film can therefore be eliminated with no unevenness depending on places within the plane of the substrate to be processed, and the potential of unevenness created on the substrate to be processed can be suppressed during processing, so that the degradation in the characteristic of a semiconductor device can also be prevented. The effect is particularly remarkable in the case of a substrate to be processed having a large diameter of greater than 8 inches.

In a plasma processing device having such a diffusion type high density plasma generation source, since the electric power for forming the plasmas and the substrate bias voltage can be controlled independently, incident ion energy can be optimized while ensuring the processing speed and the uniformity within the plane at an optimal condition. This enables a substrate bias voltage to be set accurately to thoroughly remove the native oxide film at the bottom of the contact hole without damaging the semiconductor device. The value for the optimum substrate bias voltage is generally within a range from 200 to 800 V dependent on device factors. The relationship is apparent from FIG. 7 showing a substrate bias voltage and a bias resistance value. In the figure, the abscissa shows a substrate bias voltage, and the ordinate on the left shows a serial resistance value of $10^5$ contact chains formed to an interlayer insulation film between two Al interconnectings. As apparent from the above-mentioned relationship, the contact resistance value increases abruptly at a substrate bias voltage of lower than 200 V and the native oxide film can not be eliminated sufficiently.

The ordinate on the left of FIG. 7 also shows a ratio of acceptance for MOS diode. This shows a ratio of MOS diodes formed on a substrate to be processed which remain as accepted products with no insulation destruction due to charges induced by incident Ar ion for the oxide films. The oxide film used in this experiment is as thin as 11 nm and is set to a condition tending to cause insulation destruction. As can be seen from the foregoing relationship, if the substrate bias voltage exceeds 800 V, the ratio of accepted products is reduced abruptly. Then in the present invention, the substrate bias voltage is defined as between 200 V and 800 V.

By the way, a parallel plate type plasma CVD device used generally so far has a plasma density on the order of $1 \times 10^9/cm^3$. Even in a parallel plate type magnetron CVD device using a magnetic field, the plasma density is on the order of $1 \times 10^{10}/cm^3$. In a case of using the plasma generation source having such a plasma density, a bias voltage at about 1000 V has been used usually for attaining a sufficiently low contact resistance value, in which the ratio of acceptance of MOS diodes having 11 nm oxide film is about 20%. On the other hand, in the plasma processing according to the present invention using a high density plasma between $1 \times 10^{11}/cm^3$ and $1 \times 10^{14}/cm^3$, a ratio of acceptance of more than 90% is obtained as shown in FIG. 7.

On the other hand, an upper limit of the plasma density has a close relationship with an etching gas pressure. At a gas pressure on the order of $10^{-1}$ Pa $-10^0$ Pa as a main operation pressure of a high density plasma CVD device used in the present invention, a plasma density of $1 \times 10^{14}/cm^3$ is a value approximate to complete dissociation. Since the vertical incident component of ions is increased by applying sputter etching with high density plasmas at such a high vacuum, a sufficient etching rate can be obtained with less damages while reducing the substrate bias voltage.

BRIEF DESCRIPTION OF THE DRAWINGS

FIGS. 1A, 1B, and 1C show schematic cross sectional views for Examples 1, 2, 3 and 4, to which the present invention is applied in the order of steps, in which FIG. 1A shows a state where a native oxide film is formed at the bottom of a contact hole facing lower interconnections, FIG. 1B shows a state of removing the native oxide film at the bottom of the contact hole and FIG. 1C shows a state of forming upper interconnections continuously;

FIG. 5 is a schematic cross sectional view of a substrate bias device applying the wave type processing used in Example 4 to which the present invention is applied;

DETAILED DESCRIPTION OF THE PREFERRED EMBODIMENTS

The present inventors have already filed an invention for a dry pretreatment method of removing a native oxide film at the bottom of a contact hole by a plasma processing device having a diffusion type high density plasma generation source, while suppressing a substrate bias voltage as Japanese Patent Application Hei 5-261854. This method uniformly removes a native oxide film at the bottom of a fine contact hole formed to a large diameter substrate without giving damages.

Figure 6:
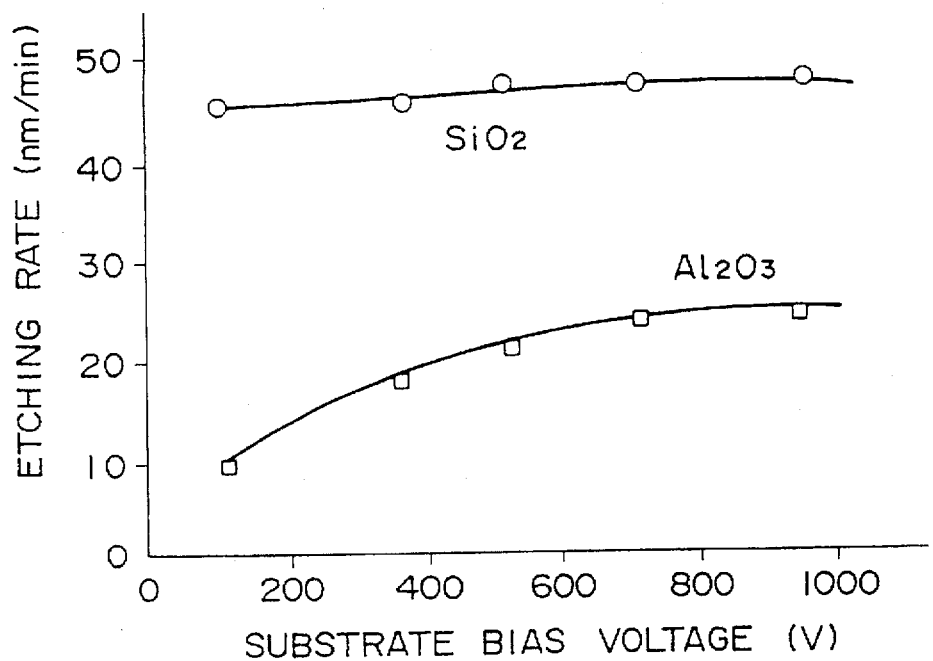
FIG. 6 is a graph showing a relationship between an etching rate for $SiO_2$ and $Al_2O_3$, and a substrate bias voltage.
Figure 7:
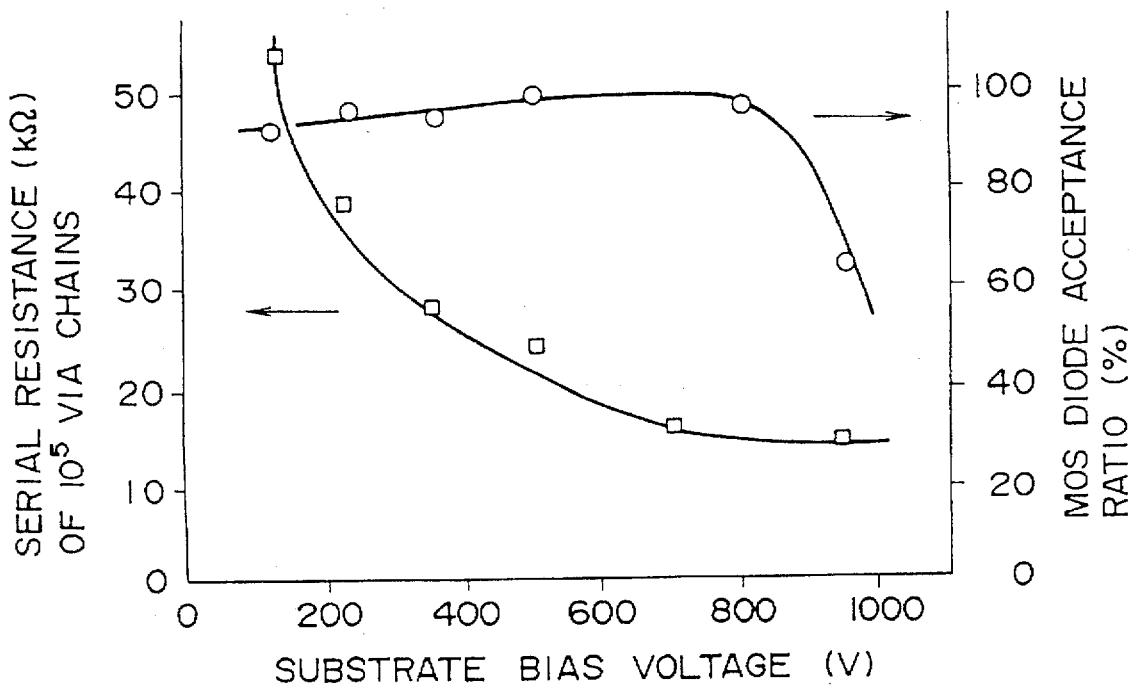
FIG. 7 is a graph illustrating a relationship for each of serial resistance of $10^5$ contact chains and ratio of acceptance of MOS diodes, relative to a substrate bias voltage.

However, in a contact hole opened to an interlayer insulation film on lower interconnections made, for example, of Al-based metal, it has been found that, although the method can provide excellent uniformity of processing, it can not always sufficiently remove the native oxide film. This is because the native oxide film at the surface of the lower interconnections made of the Al-based metal layer mainly comprises $Al_2O_3$, which is less easily removed by sputter etching compared with $SiO_2$-based native oxide film. This is illustrated in FIG. 6 as a relationship between the etching rate for $SiO_2$ and $Al_2O_3$, and a substrate bias voltage. FIG. 6 is the graph showing a result of an experiment in which sputter etching is applied to $SiO_2$ and $Al_2O_3$ by using Ar under identical conditions in a substrate bias applying type sputter etching device. As is apparent from FIG. 6, the sputter etching rate for $Al_2O_3$ is one to several fractions of that of $SiO_2$. The trend becomes more conspicuous in a fine contact hole having a large aspect ratio with less vertical incident component of Ar.

Non-oxidative plasma processing is applied to a native oxide film on the surface of the lower interconnections exposed at the bottom of a contact hole facing the lower interconnections, by using a plasma processing device having a diffusion type plasma generation source capable of obtaining a plasma density of between $1 \times 10^{11}/cm^3$ and $1 \times 10^{14}/cm^3$, while applying a substrate bias voltage, for example, about 200 V and 800 V. The present invention is effective to a case where at least an upper portion of the lower interconnections comprises an Al-based metal layer.

The present invention will be explained by way of concrete examples with reference to the drawings.

EXAMPLE 1

In this example, the present invention is applied to a pretreatment upon metallization of an upper layer wiring material with an Al-based metal layer on a contact hole for establishing ohmic contact with respect to lower layer Al-based metal wirings, by using a plasma processing device having an ICP generation source, which will be explained with reference to FIGS. 1A–1C and FIG. 2.

In a substrate to be processed used in this example, a contact hole and lower interconnections 3 made of an Al-based metal are formed on a lower layer interlayer insulation film 2 facing an impurity diffusion layer (not illustrated) of a semiconductor substrate 1, made of Si, for example, and a contact hole 5 is opened to in upper layer interlayer insulation film 4 thereover. The lower interconnections 3 are formed successively by a barrier metal layer and an Al-based metal layer comprising a Ti-based material successively, for example, by sputtering, and a native oxide film 6 of $AlO_x$-based is formed on the exposed surface at the bottom of the contact hole 5. This is shown in FIG. 1A.

Figure 2:
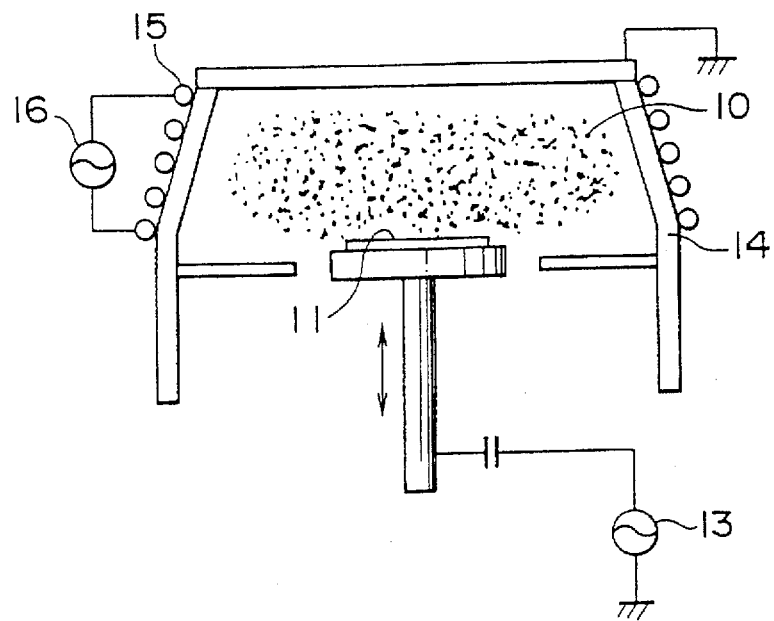
FIG. 2 is a schematic cross sectional view of a substrate bias device applying the processing type used in Example 1 to which the present invention is applied.

FIG. 2 is a schematic cross sectional view of an ICP processing device used in this example. In this device, induction-coupling coils 15 are wound around by multiturns on the side wall of a plasma processing chamber 14 constructed with a dielectric material such as quartz, and a power from an ICP power source 16 is supplied by way of the coils into the plasma processing chamber 14 to generate high density plasmas 10. A substrate 11 to be processed is placed on a substrate stage 12 to which a substrate bias power source 13 is applied, and predetermined plasma processing is applied. The substrate stage 12 is vertically movable in the axial direction of the induction-coupled coils 15 to enable processing by a diffusion type plasma mode. In FIG. 2, details for the processing gas introduction port, evacuation system, gate valve, and transportation system or the like of the substrate 11 to be processed are omitted. The device has a feature in that plasmas can be excited by a great electric power by a large sized multiturn induction-coupled coils 15 and the processing can be processed at a high plasma density in the order of $10^{12}/cm^3$.

Figure 1A:
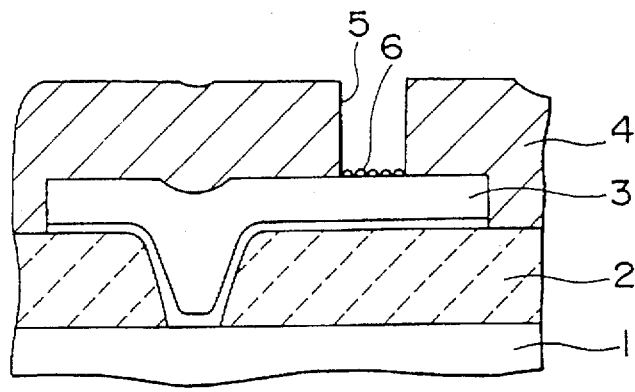

The substrate 11 to be processed shown in FIG. 1A was set on the substrate stage 12 and applied with a pretreatment for metallization under the following conditions as an example.

| Ar | 25 sccm |
| --- | --- |
| Gas pressure | 0.13 Pa |
| ICP power source power | 1000 W (13.56 MHz) |
| Substrate bias voltage | 350 V |

Figure 1B:
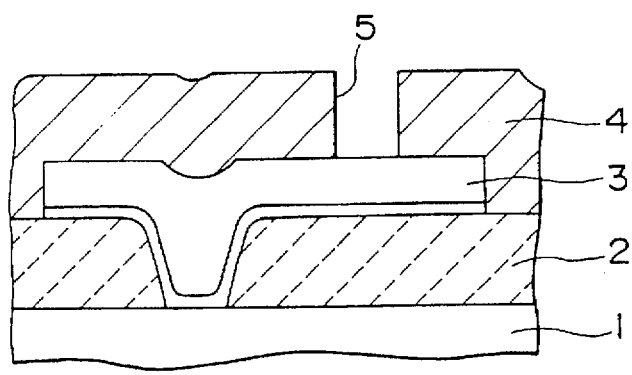

In the plasma processing step, although the substrate bias voltage was lowered remarkably as 350 V, compared with 1000 V of a substrate bias voltage required for the existent parallel plate type plasma processing device, the native oxide film 6 was eliminated sufficiently and uniformly and the damage caused was reduced. This is because the gas pressure can be set to a high vacuum by the adoption of the high density plasma generation source, so that scattering of incident ions can be reduced, whereby the substrate bias voltage can be set low without deteriorating the processing speed at the bottom of the contact hole having a high aspect ratio. FIG. 1B shows a state of the substrate to be processed after plasma processing.

Figure 1C:
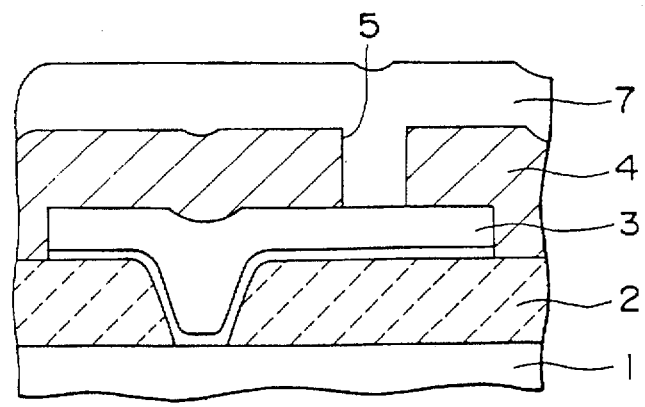

The substrate to be processed after the completion of the plasma processing for removing the native oxide film is transported by way of a gate valve under vacuum or in a reduced pressure atmosphere to a metal film forming device such as a sputtering device, and an Al-based metal layer, for example, was sputtered to form upper interconnections 7. FIG. 1C shows this state. In this example, pretreatment for removing the native oxide film could be attained uniformly and with less damage to a large diameter substrate to be processed by using the ICP processing device and at the low substrate bias voltage.

EXAMPLE 2

In this example, the present invention was applied to the pretreatment of a substrate to be processed like that in Example 1, by using a plasma processing device having a TCP generation source, which will be explained with reference to FIGS. 1A–1C and FIG. 3. Since the substrate to be processed used in this example is identical with that shown in FIG. 1A used in Example 1, duplicate explanations will be omitted.

Figure 3:
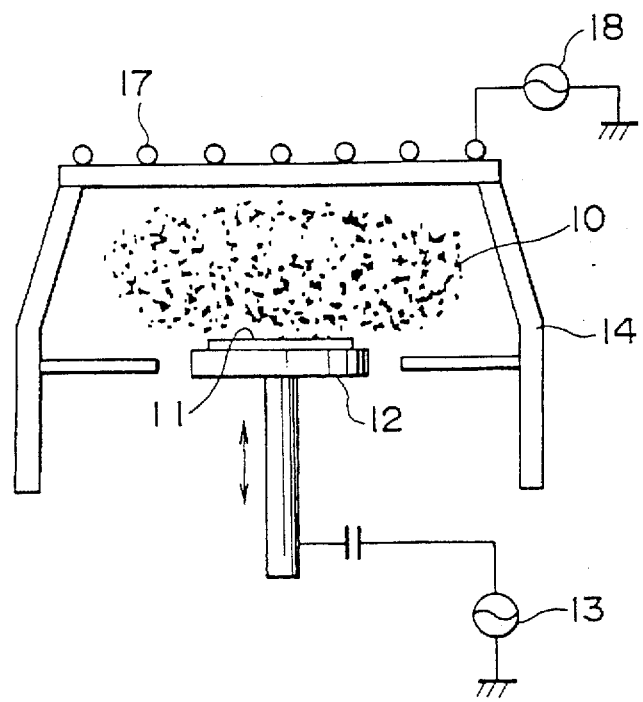
FIG. 3 is a schematic cross sectional view of a substrate bias device applying the TCP processing type used in Example 2 to which the present invention is applied.

An example of a schematic constitution for a TCP processing device in this example will be explained with reference to FIG. 3. This device has substantially the same basic constitution as that of the ICP processing device shown in FIG. 2, in which identical components carry the same reference numerals, for which detailed descriptions will be omitted. In the characteristic feature of this device, a top plate of a plasma processing chamber 14 is constructed with a dielectric material such as quartz and spiral TCP coils 17 are disposed on the upper surface to introduce power from the TCP power source 18 into the plasma processing chamber 14. A substrate stage 12 is vertical movable in the axial direction of the TCP coils 17 to enable processing in a diffusion type plasma mode. In the figure, details for a processing gas introduction port, an evacuation system, a gate valve and a transportation system or the like for the substrate 11 to be processed will be omitted. In this device, high density plasmas at about $10^{12}/cm^3$ can be formed by induction coupling between the large-sized TCP coils 17 and processing gases in the plasma processing chamber 14.

The substrate 11 to be processed shown in FIG. 1A was set on the substrate stage 12 and pretreatment for metallization was applied, for example, under the following conditions.

| Ar | 25 sccm |
| --- | --- |
| Gas pressure | 0.13 Pa |
| TCP power source power | 1000 W (13.56 MHz) |
| Substrate bias voltage | 350 V |

Also in the plasma processing step, although the substrate bias voltage was lowered remarkably as 350 V, compared with 1000 V of a substrate bias voltage required for the existent parallel plate type plasma processing device, the native oxide film 6 was eliminated sufficiently and uniformly and the damage reduced as well. This is because the gas pressure can be set to a high vacuum region by the adoption of the high density plasma generation source, so that scattering of incident ions can be reduced, whereby the substrate bias voltage can be set low without deteriorating the processing speed at the bottom of the contact hole having a high aspect ratio.

FIG. 1B shows a state of the substrate to be processed after plasma processing.

The substrate to be processed after the completion of the plasma processing for removing the native oxide film, is transported by way of a gate valve under vacuum or in a reduced pressure atmosphere to a metal film forming device such as a sputtering device, and an Al-based metal layer, for example, was sputtered to form upper interconnections 7. FIG. 1C shows this state. In this example, pretreatment for removing the native oxide film could be attained uniformly and with less damages relative to a large diameter substrate to be processed by adopting the TCP processing device at a low substrate bias voltage.

EXAMPLE 3

In this example, the present invention was applied to the pretreatment of a substrate to be processed like that in Example 1, using a plasma processing device having an ECR plasma generation source, which will be explained with reference to FIGS. 1A–1C and FIG. 4. Since the substrate to be processed used in this example is identical with that shown in FIG. 1A for Example 1, duplicate explanations will be omitted.

Figure 4:
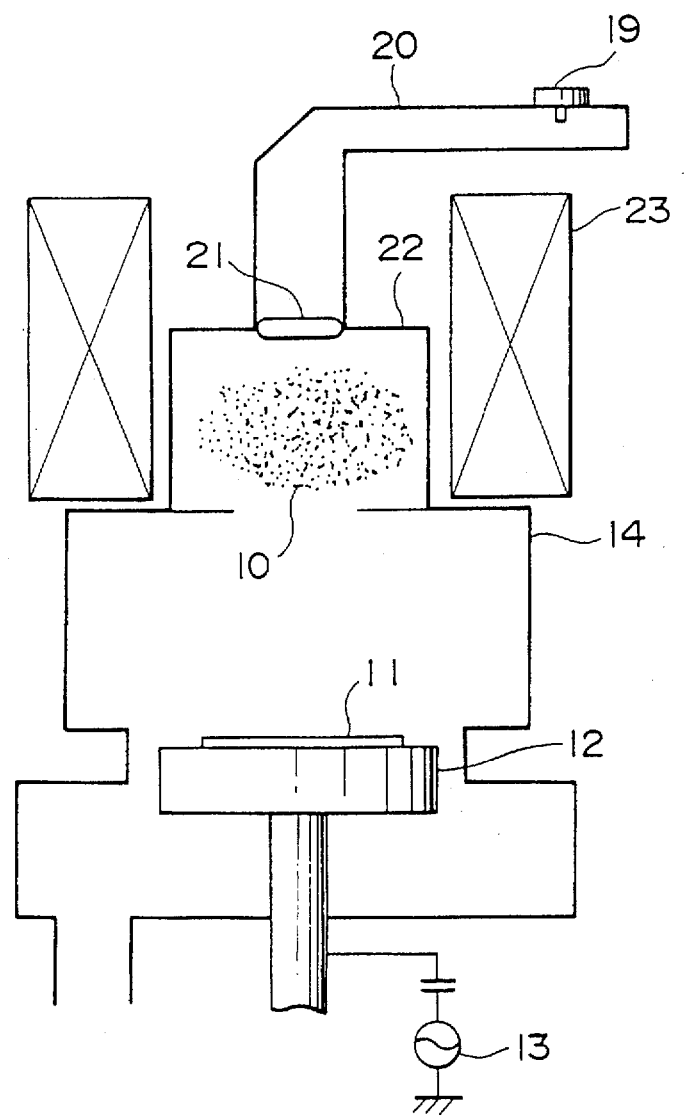
FIG. 4 is a schematic cross sectional view of a substrate bias device applying the ECR processing type used in Example 3 to which the present invention is applied.

An example of a schematic constitution for a ECR plasma processing device in this example will be explained with reference to FIG. 4. In this device, identical components as those of the ICP processing device shown in FIG. 2 carry same reference numerals, for which detailed description will be omitted. In this device, microwaves at 2.45 GHz formed by a magnetron 19 are introduced by way of a microwave guide 20 and a microwave introduction window 21 made of a dielectric material such as quartz into a plasma generation chamber 22. The microwaves are interacted with magnetic fields at 0.0875 T excited from solenoid coils 23 disposed by turning around a plasma generation chamber 22, to form high density plasmas of processing gases in the plasma generation chamber 22. A plasma processing chamber 14 is in contiguous with the plasma generation chamber 22 to enable processing by a diffusion type plasma mode. In the figure, details for the processing gas introduction port, the vacuum exhaustion system, the gate valve and the transportation system for the substrate 11 to be processed are not illustrated. In this device, the processing gases in the plasma generation chamber 22 are dissociated at a high efficiency by the ECR mode, thereby enabling to produce high density plasma in the order of $10^{11}/cm^3$ to $10^{12}/cm^3$.

The substrate 11 to be processed shown in FIG. 1A was transported in vacuum and set on the substrate stage 12 and pretreatment for metallization was applied, for example, under the following conditions:

| | |
|---|---|
| Ar | 25 sccm |
| Gas pressure | 0.13 Pa |
| Microwave power source power | 900 W (2.45 GHz) |
| Substrate bias voltage | 350 V (2 MHz) |

Also this the plasma processing step, although the substrate bias voltage was lowered remarkably as 350 V, compared with 1000 V of a substrate bias voltage required for the existent parallel plate type plasma processing device, the native oxide film 6 was eliminated sufficiently and uniformly and the damage was reduced as well. This is because the gas pressure could be set to a high vacuum region by the adoption of the high density plasma generation source, so that scattering of incident ions could be reduced, whereby the substrate bias voltage could be set low without deteriorating the processing speed at the bottom of the contact hole having a high aspect ratio. FIG. 1B shows a state of the substrate to be processed after plasma processing.

The substrate to be processed after the completion of the plasma processing for removing the native oxide film is transported by way of a gate valve under vacuum or in a reduced pressure atmosphere to a metal film forming device such as a sputtering device, and an Al-based metal layer, for example, was sputtered to form upper interconnections 7. FIG. 1C shows this state. In this example, pretreatment process for removing the native oxide film could be established uniformly and with less damages relative to a large diameter substrate to be processed by adopting the ECR plasma processing device at a low substrate bias voltage.

EXAMPLE 4

In this example, the present invention was applied to the pretreatment of a substrate to be processed like that in Example 1, by using a plasma processing device having an ECR plasma generation source, which will be explained with reference to FIGS. 1A–1C and FIG. 4. Since the substrate to be processed in this example is identical with that shown in FIG. 1A for Example 1 duplicate explanations will be omitted.

An example of a schematic constitution for a substrate bias device applying helicon wave plasma processing will be explained with reference to FIG. 5. In this device, identical components with those of the ICP processing device shown in FIG. 2 carry the same reference numerals and detailed descriptions will be omitted. In this device, an electric field generated by supplying an electric power from a helicon wave power source 25 to a helicon wave antenna 24 and a magnetic field formed by a solenoid assembly 26 interact to each other to generate whistler waves (helicon waves) to a bell jar 27 which is a plasma generating chamber made of a dielectric material such as quartz thereby dissociating processing gases supplied to the bell jar 27 at a high efficiency. The plasma processing chamber 14 is contiguous with the bell jar 27 thereby enabling processing by diffusion type high density plasmas 10. Multiple magnets 28 disposed around the plasma processing chamber 14 generate a magnetic filed for confining the high density plasmas 10 within the plasma processing chamber 14. Also in this figure, details for the processing gas introduction port, the vacuum exhaustion system, the gate valve and the transportation system for the substrate 11 to be processed are not illustrated. In this device, a high plasma density at an order of $10^{13}/cm^3$ can be obtained which is further higher than that in any of the examples described above by the structural characteristic of the helicon wave antenna.

The substrate 11 to be processed shown in FIG. 1A was transported under vacuum and set on the substrate stage 12 and pretreatment for metallization was applied, for example, under the following conditions:

| | |
|---|---|
| Ar | 25 sccm |
| Gas pressure | 0.13 Pa |
| Helicon wave power source power | 1000 W (13.56 MHz) |
| Substrate bias voltage | 250 V (2 MHz) |

Also in the plasma processing step, although the substrate bias voltage was lowered remarkably as 250 V, compared with 1000 V of a substrate bias voltage required for the existent parallel plate type plasma processing device, the native oxide film 6 was eliminated sufficiently and uniformly and the damage could be reduced as well. This is because the gas pressure could be set to a high vacuum region by the adoption of the high density plasma generation source, so that scattering of incident ions could be reduced, whereby the substrate bias voltage could be set low without deteriorating the processing rate at the bottom of the contact hole having a high aspect ratio. FIG. 1B shows a state of the substrate to be processed after plasma processing.

The substrate to be processed after the completion of the plasma processing for removing the native oxide film was transported by way of a gate valve under vacuum or in a reduced pressure atmosphere to a metal film forming device such as a sputtering device, and an Al-based metal layer, for example, was sputtered to form upper interconnections 7. FIG. 1C shows this state. In this example, the pretreatment process for removing the native oxide film was attained uniformly and with less damages relative to a large diameter substrate to be processed by adopting the helicon wave plasma processing device and the low substrate bias voltage.

While the present invention has been explained with reference to four examples, the present invention is not restricted only to such examples.

For instance, explanations have been made to the examples for the process of removing the native oxide film at the bottom of the contact hole on the lower layer wiring made of Al-based metal having a barrier metal structure. However, in addition to the above-mentioned lower layer wiring structure, the present invention is applicable also to lower interconnections of a laminate structure in which an Al system metal layer is formed on a high melting metal layer such as made of W, or to lower interconnections comprising a single Al system metal layer. Further, in addition to the Al-based metal layer the invention is also applicable to a native oxide film removing process in a case of lower interconnections such as made of Cu, Cr or W which readily forms a strong oxide film.

Although Ar is shown as an example of a processing gas, rare gas such as He, Ne, Kr and Xe may be used alone or in combination. However, since He and Ne have a small mass, a rare gas having a mass greater than that of Ar is preferred in view of the sputtering efficiency for the removal of the native oxide film. Further, reducing gas, for example, H-based gas such as $H_2$, or $BCl_3$ or $BBr_3$ may also be added.

Although the substrate bias applying type ECR plasma processing device, ICP processing device, TCP process device and the helicon wave plasma processing device are shown as examples, the effect of the present invention can be attained also in other plasma processing devices providing that they have a diffusion plasma generation source capable of obtaining a plasma density of between $1 \times 10^{11} cm^3$ and $1 \times 10^{14}/cm^3$.

As apparent from the foregoing explanations, according to the present invention, a strong native oxide film such as $Al_2O_3$ formed at the bottom of the contact hole on the lower interconnections such as made of Al-based metal or the like can be removed thoroughly without damaging the substrate to be processed.

Further, according to the present invention, the effect described above can be attained at a good uniformity even for a large diameter substrate to be processed in which a plurality of fine contact holes with a large aspect ratio are formed. This enables the formation of multilevel interconnections with reliability and with less ohmic contact and the present invention contributes much to a process for producing a semiconductor device based on a fine design rule.

What is claimed is:

1. A method of manufacturing a semiconductor device having multilevel interconnections comprising:

forming a lower interconnecting layer through a first interlayer insulation film on a semiconductor substrate wherein the lower interconnecting layer is an Al-based metal layer, forming a second interlayer insulation film on said lower interconnecting layer and forming a contact hole in said second interlayer insulation film so as to expose a portion of said lower interconnecting layer;

removing a native oxide film formed on said lower interconnecting layer, said removing being performed by non-oxidative plasma processing using a plasma processing device having a plasma generation source generating a plasma density of between $1 \times 10^{11}/cm^3$ and $1 \times 10^{14}/cm^3$, while applying a substrate bias voltage; and forming an upper interconnecting layer after removing the native oxide film so as to fill said contact hole and contact said lower interconnecting layer.

2. A method of manufacturing a semiconductor device as defined in claim 1, wherein the substrate bias voltage is between 200 V and 800 V.

3. A method of manufacturing a semiconductor device as defined in claim 1, wherein the plasma processing device is constructed such that a power source for said plasma generation source and a substrate bias voltage can be controlled independently.

4. A method of manufacturing a semiconductor device as defined in claim 1, wherein the plasma processing device is a ECR plasma processing device, an ICP processing device, a TCP processing device or a helicon wave plasma processing device.

5. A method of manufacturing a semiconductor device as defined in claim 1, wherein said removing the native oxide film and forming the upper interconnecting layer are conducted in sequence while said semiconductor device is constantly exposed to a vacuum.

6. A method of manufacturing a semiconductor device having multilevel interconnections comprising:

forming a lower interconnecting layer through a first interlayer insulation film on a semiconductor substrate, forming a second interlayer insulation film on said lower interconnecting layer and forming a contact hole in said second interlayer insulation film so as to expose a portion of said lower interconnecting layer;

removing a native oxide film formed on said lower interconnecting layer, said removing being performed by non-oxidative plasma processing using a plasma processing device having a plasma generation source generating a plasma density of between $1 \times 10^{11}/cm^3$ and $1 \times 10^{14}/cm^3$, while applying a substrate bias voltage; and forming an upper interconnecting layer after removing the native oxide film so as to fill said contact hole and contact said lower interconnecting layer.

7. A method of manufacturing a semiconductor device as defined in claim 6, wherein the substrate bias voltage is between 200 V and 800 V.

8. A method of manufacturing a semiconductor device as defined in claim 6, wherein the plasma processing device is adapted such that a power source for said plasma generation source and a substrate bias voltage can be controlled independently.

9. A method of manufacturing a semiconductor device as defined in claim 6, wherein said removing the native oxide film and forming the upper interconnecting layer are conducted in sequence while said semiconductor substrate is constantly exposed to a vacuum.

10. A method of manufacturing a semiconductor device as defined in claim 6, wherein said removing a native oxide film further comprises:

placing said semiconductor substrate in a plasma processing chamber of said plasma processing device; and generating a plasma with an induction coupling coil disposed on lateral sides of said plasma processing chamber.

11. A method of manufacturing a semiconductor device as defined in claim 6, wherein said removing a native oxide film further comprises:

placing said semiconductor substrate in a plasma processing chamber of said plasma processing device; and generating a plasma with TCP coils disposed on an upper surface of said plasma processing chamber.

12. A method of manufacturing a semiconductor device as defined in claim 6, wherein said removing a native oxide film further comprises:

placing said semiconductor substrate in a plasma processing chamber of said plasma processing device to which is connected a plasma generation chamber; and generating a plasma with microwaves emitted into said plasma generation chamber.

13. A method of manufacturing a semiconductor device as defined in claim 6, wherein said removing a native oxide film further comprises:

placing said semiconductor substrate in a plasma processing chamber of said plasma processing device to which is connected a plasma generation chamber; and generating a plasma with a helicon wave antenna disposed on said plasma generation chamber, wherein solenoid coils are disposed around said plasma generation chamber.

14. A method of manufacturing a semiconductor device as defined in claim 6, wherein said removing a native oxide film further comprises:

placing said semiconductor substrate on a stage in a plasma processing chamber of said plasma processing device;

adjusting the position of said stage within said plasma processing chamber to expose said semiconductor substrate to a plasma.

15. A method of manufacturing a semiconductor device as defined in claim 6, wherein said substrate has a diameter of 8 inches or more.

16. A method of manufacturing a semiconductor device as defined in claim 14, wherein said substrate bias voltage is 250 V.

17. A method of manufacturing a semiconductor device as defined in claim 6, wherein said substrate bias voltage is 200 V.

* * * * *